(12) United States Patent
Chen

(10) Patent No.: US 10,105,812 B2
(45) Date of Patent: Oct. 23, 2018

(54) POLISHING PAD CONFIGURATION AND POLISHING PAD SUPPORT

(71) Applicant: Applied Materials, Inc., Santa Clara, CA (US)

(72) Inventor: Hung Chih Chen, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 166 days.

(21) Appl. No.: 14/801,630

(22) Filed: Jul. 16, 2015

(65) Prior Publication Data

US 2016/0016281 A1    Jan. 21, 2016

Related U.S. Application Data

(63) Continuation-in-part of application No. 14/334,608, filed on Jul. 17, 2014.

(Continued)

(51) Int. Cl.
*B24B 37/10* (2012.01)
*B24B 37/26* (2012.01)
*H01L 21/67* (2006.01)
*H01L 21/321* (2006.01)
*H01L 21/768* (2006.01)
*B24B 37/11* (2012.01)
(Continued)

(52) U.S. Cl.
CPC ............ *B24B 37/10* (2013.01); *B24B 37/11* (2013.01); *B24B 37/26* (2013.01); *B24B 37/30* (2013.01); *H01L 21/30625* (2013.01); *H01L 21/31051* (2013.01); *H01L 21/3212* (2013.01); *H01L 21/32115* (2013.01); *H01L 21/7684* (2013.01)

(58) Field of Classification Search
None
See application file for complete search history.

(56) References Cited

U.S. PATENT DOCUMENTS 5,020,283 A    6/1991 Tuttle
5,177,908 A    1/1993 Tuttle
(Continued)

FOREIGN PATENT DOCUMENTS

JP    2002-103211    4/2002

OTHER PUBLICATIONS

International Search Report and Written Opinion in International Application No. PCT/US2015/040065, dated Sep. 30, 2015, 9 pages.

(Continued)

*Primary Examiner* — Sylvia MacArthur
(74) *Attorney, Agent, or Firm* — Fish & Richardson P.C.

(57) ABSTRACT

Chemical mechanical polishing can be used for "touch-up polishing" in which polishing is performed on a limited area of the front surface of the substrate. The contact area between the polishing pad and the substrate can be substantially smaller than the radius surface of the substrate. During polishing, the polishing pad can undergo an orbital motion. The polishing pad can be maintained in a fixed angular orientation during the orbital motion. The contact area can be arc-shaped. The contact area can be provided by one or more lower portions projecting downward from an upper portion of the polishing pad. A perimeter portion of the polishing pad can be vertically fixed to an annular member and a remainder of the polishing pad within the perimeter portion can be vertically free.

11 Claims, 14 Drawing Sheets

Related U.S. Application Data

(60) Provisional application No. 62/039,840, filed on Aug. 20, 2014.

(51) Int. Cl.
*B24B 37/30* (2012.01)
*H01L 21/3105* (2006.01)
*H01L 21/306* (2006.01)

(56) References Cited

U.S. PATENT DOCUMENTS

| | | | |
|---|---|---|---|
| 5,297,364 A | 3/1994 | Tuttle | |
| 5,384,986 A * | 1/1995 | Hirose | B24B 37/26 451/394 |
| 5,558,563 A * | 9/1996 | Cote | B24B 37/26 451/278 |
| 5,578,362 A * | 11/1996 | Reinhardt | B24B 37/26 257/E21.219 |
| 5,664,989 A * | 9/1997 | Nakata | B24B 37/22 451/285 |
| 5,785,584 A * | 7/1998 | Marmillion | B24B 37/04 451/283 |
| 5,897,424 A * | 4/1999 | Evans | B24B 37/26 451/285 |
| 5,921,855 A | 7/1999 | Osterheld et al. | |
| 5,938,504 A | 8/1999 | Talieh | |
| 5,980,685 A * | 11/1999 | Kimura | B24B 37/16 156/345.12 |
| 6,273,806 B1 | 8/2001 | Bennett et al. | |
| 6,315,641 B1 | 11/2001 | Lee et al. | |
| 6,328,629 B1 * | 12/2001 | Togawa | B24B 37/0053 451/287 |
| 6,331,137 B1 | 12/2001 | Raeder et al. | |
| 6,332,830 B1 | 12/2001 | Okamura et al. | |
| 6,464,574 B1 | 10/2002 | Halley | |
| 6,514,123 B1 * | 2/2003 | Crevasse | B23Q 3/186 451/28 |
| 6,517,419 B1 | 2/2003 | Halley | |
| 6,561,881 B2 | 5/2003 | Jeong | |
| 7,238,093 B1 * | 7/2007 | Sakamoto | B24B 37/26 257/E21.23 |
| 7,267,610 B1 | 9/2007 | Elmufdi et al. | |
| 8,851,959 B2 | 10/2014 | Jiang et al. | |
| 2001/0005667 A1 | 6/2001 | Tolles et al. | |
| 2001/0019934 A1 | 9/2001 | Nishimura et al. | |
| 2002/0037649 A1 * | 3/2002 | Shingu | B24B 37/042 438/692 |
| 2002/0037685 A1 | 3/2002 | Matsuo et al. | |
| 2002/0132566 A1 | 9/2002 | Jeong | |
| 2003/0119431 A1 | 6/2003 | Boyd et al. | |
| 2003/0168169 A1 | 9/2003 | Ishikawa et al. | |
| 2008/0293332 A1 | 11/2008 | Watanabe et al. | |
| 2011/0195639 A1 * | 8/2011 | Chen | B24B 37/32 451/41 |
| 2012/0171933 A1 * | 7/2012 | Chen | B24B 37/005 451/28 |
| 2014/0209239 A1 | 7/2014 | Ko et al. | |
| 2015/0111478 A1 | 4/2015 | Chen et al. | |
| 2016/0016280 A1 | 1/2016 | Chen et al. | |
| 2016/0016281 A1 * | 1/2016 | Chen | B24B 37/26 156/345.12 |
| 2016/0016282 A1 * | 1/2016 | Chen | B24B 37/26 156/345.12 |
| 2017/0203405 A1 | 7/2017 | Chen et al. | |

OTHER PUBLICATIONS

International Search Report and Written Opinion in International Application No. PCT/US2017/022924, dated Jun. 29, 2017, 14 pages.

\* cited by examiner

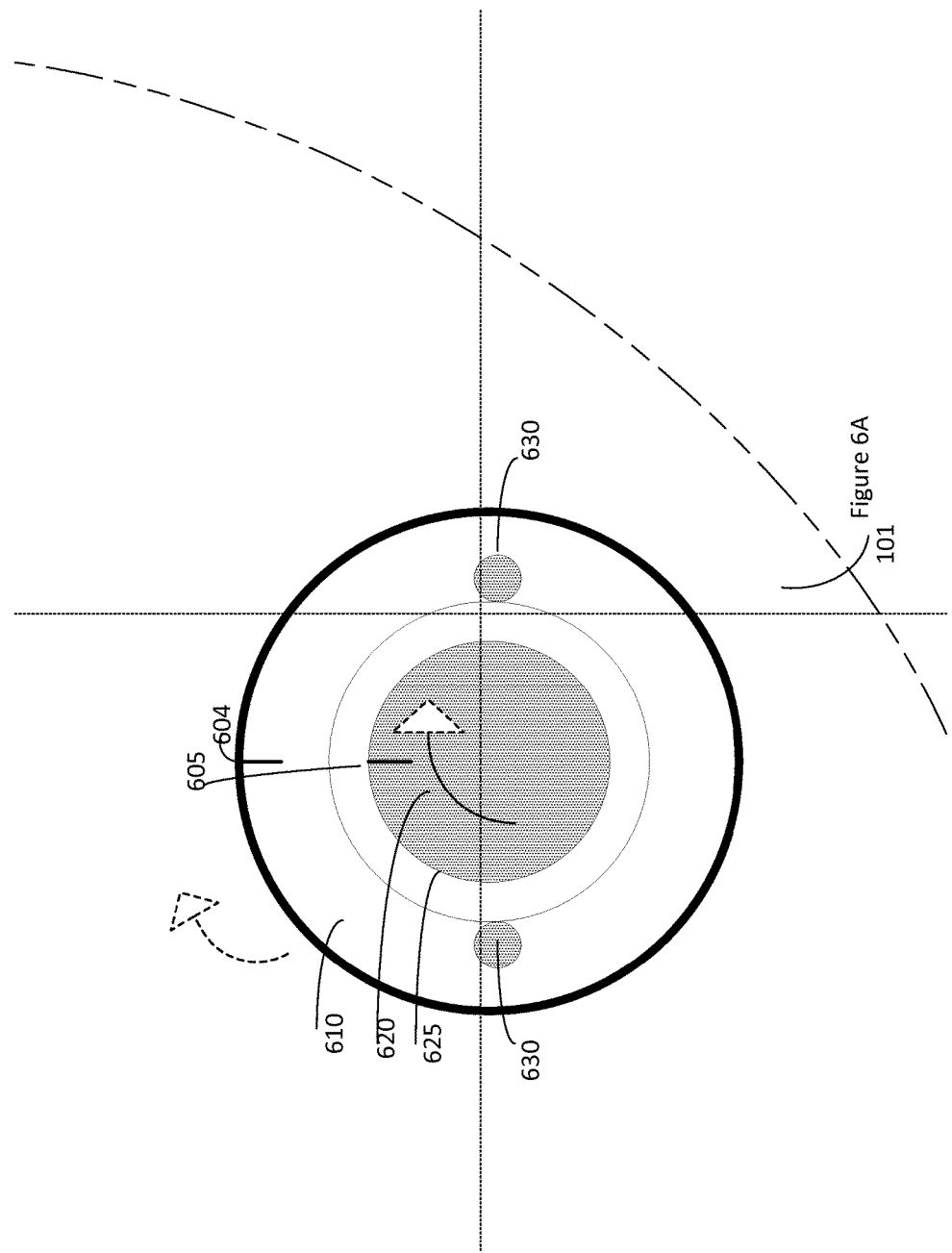

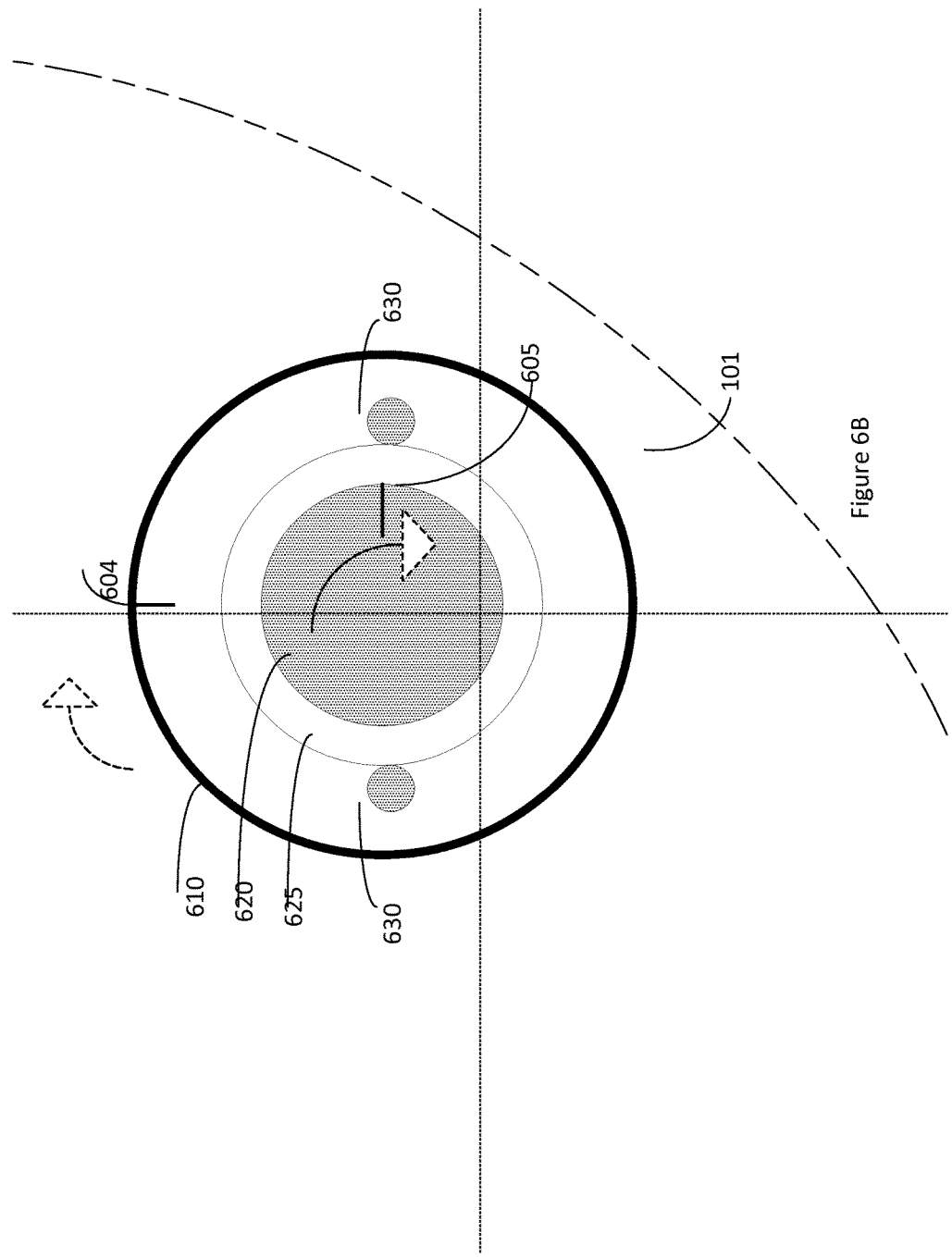

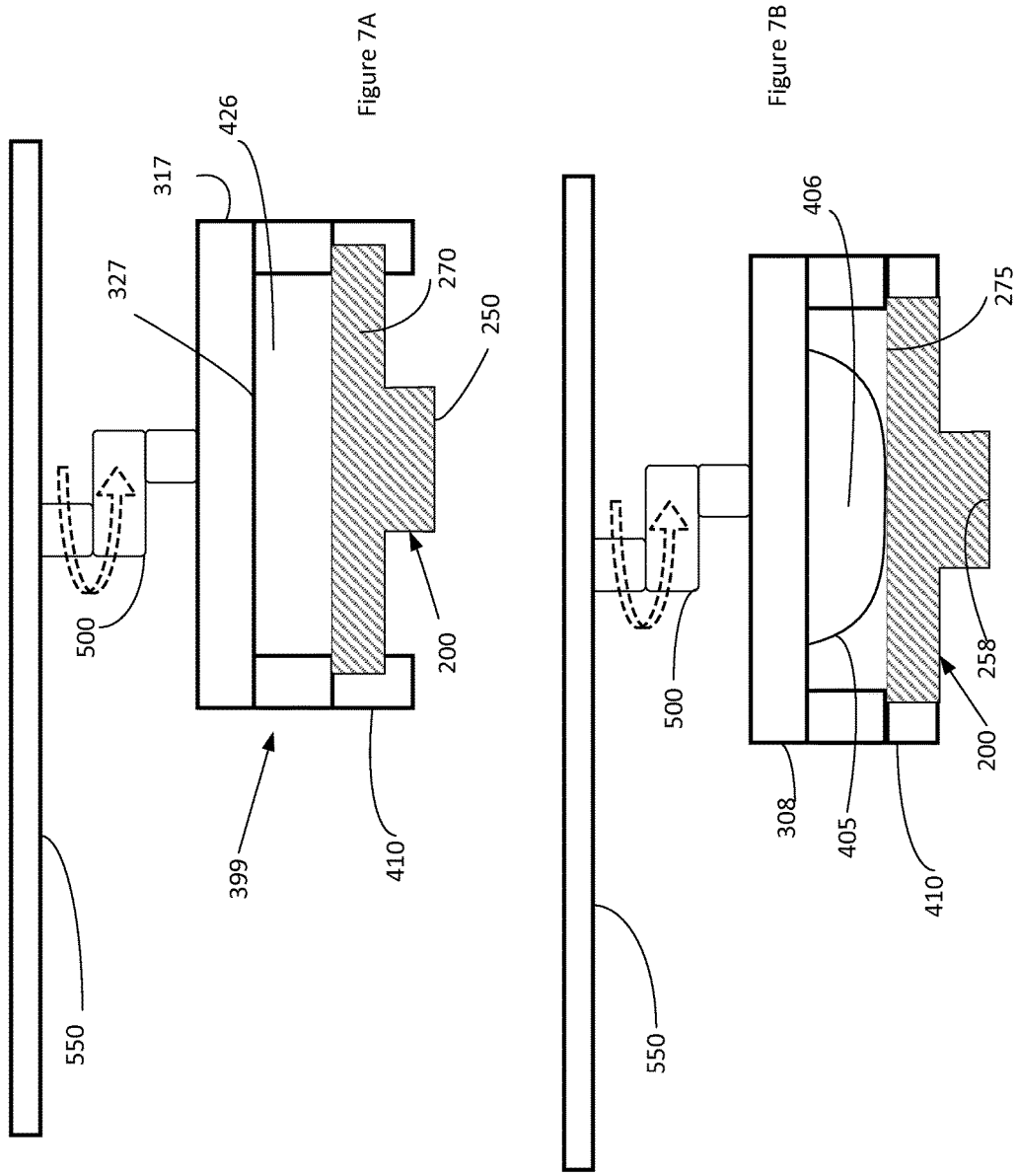

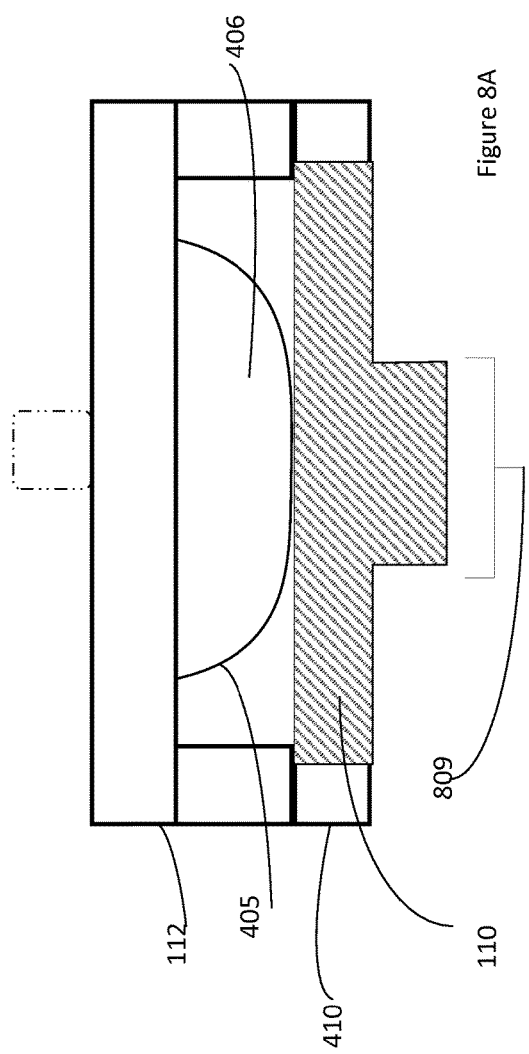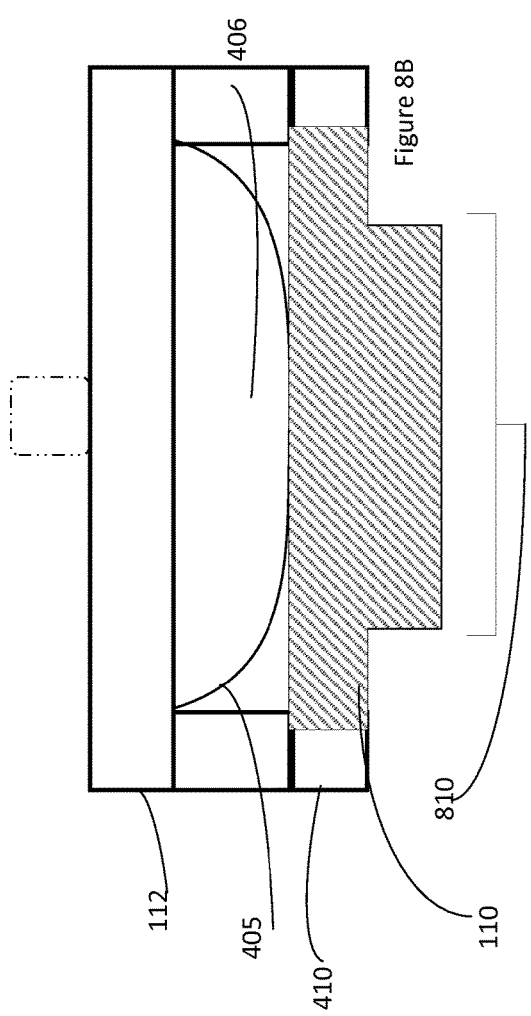

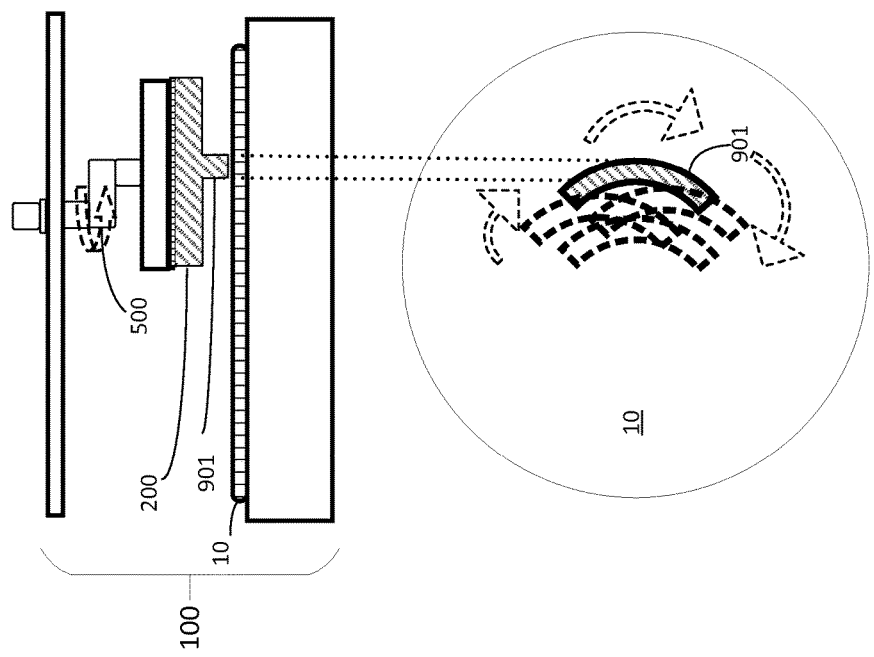
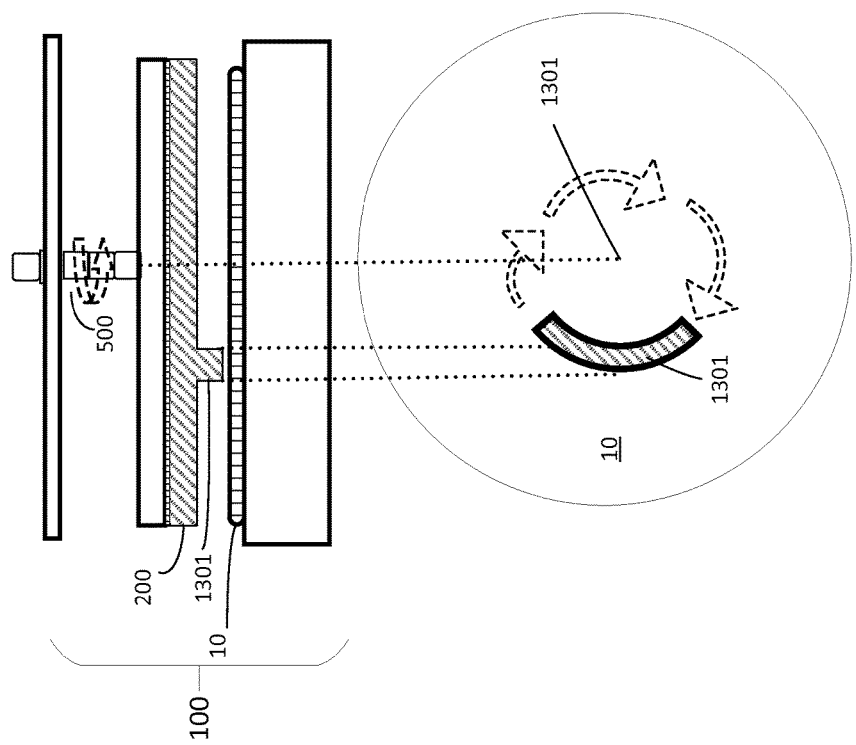

POLISHING PAD CONFIGURATION AND POLISHING PAD SUPPORT

CROSS-REFERENCE TO RELATED APPLICATIONS

This application is a continuation-in-part of U.S. application Ser. No. 14/334,608, filed on Jul. 17, 2014, and this application claims priority to U.S. Application Ser. No. 62/039,840, filed on Aug. 20, 2014, the entire disclosures of which are incorporated by reference.

TECHNICAL FIELD

This disclosure relates to the architecture of and a polishing pad for a chemical mechanical polishing (CMP) system.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the metallic layer remaining between the raised pattern of the insulative layer form vias, plugs, and lines that provide conductive paths between thin film circuits on the substrate. For other applications, such as oxide polishing, the filler layer is planarized until a predetermined thickness is left over the non-planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

SUMMARY

The present disclosure provides systems and apparatus for polishing of substrates, e.g., "touch-up polishing," in which polishing is performed on a limited area of the front surface of the substrate.

In one aspect, a chemical mechanical polishing system includes a substrate support, a movable pad support and a drive system. The substrate support is configured to hold a substrate in a substantially fixed angular orientation during a polishing operation. The movable pad support is configured to hold a polishing pad having a diameter no greater than a radius of the substrate. The drive system is configured to move the pad support and polishing pad in an orbital motion while the polishing pad is in contact with an upper surface of the substrate. The orbital motion has a radius of orbit no greater than a diameter of the polishing pad and maintains the polishing pad in a fixed angular orientation relative to the substrate.

Implementations may include one or more of the following features. The polishing pad may have a contact area to contact the substrate. A diameter of the contact area may be between about 1 and 10% of the diameter of the substrate. The radius of orbit may be between about 5 and 50% of the diameter of the contact area. The drive system may include a recess in the pad support head, a rotatable cam extending into the recess, and a motor to the cam. Linkages may couple the pad support head to a fixed support to prevent rotation of the pad support head. A positioning drive system may move the pad support head laterally across the substrate. The positioning drive system may include two linear actuators configured to move the pad support head in two perpendicular directions.

In another aspect, a chemical mechanical polishing system includes a substrate support, a polishing pad, a movable pad support and a drive system. The substrate support is configured to hold the substrate in a substantially fixed angular orientation during a polishing operation. The polishing pad has a contact area for contacting the substrate, the contact area having a diameter no greater than a radius of the substrate. The movable pad support is configured to hold the polishing pad. The drive system is configured to move the pad support and polishing pad in an orbital motion while the contact area of the polishing pad is in contact with an upper surface of the substrate. The orbital motion has a radius of orbit no greater than a diameter of the polishing pad and maintains the polishing pad in a fixed angular orientation relative to the substrate.

Implementations may include one or more of the following features. The polishing pad may include a protrusion from a layer, and a bottom surface of the protrusion may provide the contact area. At least one of a pressure sensitive adhesive or a clamp may hold the polishing pad on the pad support. The contact area may be disk-shaped or arc-shaped.

In another aspect, a method of chemical mechanical polishing includes bringing a polishing pad into contact with a substrate in a contact area having a diameter no greater than a radius of the substrate, and generating relative motion between the polishing pad and the substrate while the contact area of the polishing pad is in contact with an upper surface of the substrate. The relative motion includes an orbital motion having a radius of orbit no greater than a diameter of the polishing pad. The polishing pad is maintained in a substantially fixed angular orientation relative to the substrate during the orbital motion.

Implementations may include one or more of the following features. The substrate may be held in a fixed lateral position during the orbital motion. The polishing pad may be swept laterally across the substrate during the orbital motion at a velocity no greater than about 5% of an instantaneous velocity of the orbital motion.

In another aspect, a chemical mechanical polishing system includes a substrate support configured to hold a substrate during a polishing operation, a polishing pad support; a polishing pad held by the pad support, and a drive system configured to generate relative motion between the substrate support and the polishing pad support. The polishing pad has an upper portion secured to the polishing pad support and a lower portion projecting downward from the upper portion. An upper surface of the upper portion abuts the polishing pad support. A bottom surface of the lower portion provides a contact surface to contact a top surface of the substrate during polishing. The contact surface is smaller than the top surface of the substrate. The upper portion has a first lateral dimension and the lower portion has a second lateral dimension that is less than the first lateral dimension.

Implementations may include one or more of the following features. The polishing pad support may include a plate having a surface that spans the polishing pad, and substantially all of an upper surface of the upper portion of the polishing pad may abut the surface of the plate. An adhesive may hold the polishing pad on the pad support. The polishing pad support may include an annular member, a perimeter portion of an upper surface of the upper portion of the polishing pad may abuts the annular member, and a remainder of the upper surface within the perimeter portion may not contact the polishing pad support. One or more clamps may hold a perimeter section of the polishing pad on the pad support. The upper portion of the polishing pad may include a flexing section having a greater flexibility than a section of the polishing pad above the contact surface. The upper portion of the polishing pad may include a polyethylene terephthalate sheet.

A plurality of grooves for slurry transport may be formed on the contact surface of the lower portion of the polishing pad. The plurality of grooves may have a depth less than a thickness of the lower portion. At least some of the plurality of grooves may extend entirely across the lower portion of the polishing pad. A pressure chamber may be formed by an interior chamber of the polishing pad support, the chamber may have a substrate-facing opening, and the opening may be sealed by a coupling of the polishing pad to the polishing pad support. A plurality of apertures may be formed in the upper surface of the polishing pad, and a plurality of projections from the polishing pad support may fit into the plurality of apertures to align the lower portion relative to the polishing pad support.

In another aspect, a polishing pad includes and upper portion and one or more lower portions. The upper portion has an upper surface for attachment to a pad carrier and a first lateral dimension. The one or more lower portions project downward from the upper portion. A bottom surface of the one or more lower portions provide a contact surface to contact a substrate during chemical mechanical polishing. Each lower portion has a second lateral dimension that is less than the first lateral dimension. A total surface area of the contact surface from the one or more lower portions is no more than 10% of a surface area of the upper surface.

Implementations may include one or more of the following features. At least the lower portion may include a polymer body of substantially uniform composition and having a plurality of pores distributed therein. The polishing pad may include a polishing layer, and the lower portion projecting downward may be formed in the polishing layer. The pad may include a backing layer that is softer than the polishing layer. Grooving for slurry transport may be formed on the bottom surface of the one or more lower portions. The one or more lower portions may consist of a single projection. The polishing layer may include a flexible lateral section that is thinner than the lateral section which makes up the polishing area. The lower portion may include a microporous polyurethane.

In another aspect, a chemical mechanical polishing system includes a substrate support configured to hold a substantially circular substrate during a polishing operation, a polishing pad support, a polishing pad held by the pad support, and a drive system configured to generate relative motion between the substrate support and the polishing pad support. The polishing pad has an arc-shaped contact area, and a center point of an arc defined by the arc-shaped contact area is substantially aligned with a center of the substrate held by the substrate support.

Implementations may include one or more of the following features. A width of the arc defined by the arc-shaped contact area may be between 1 mm and 3 mm, and a length of the arc may be equal to or larger than 30 mm. At least one of a pressure sensitive adhesive or a clamp may hold the polishing pad on the pad support head. The relative motion between the substrate support and the polishing pad support may be an orbital motion that maintains the polishing pad support in a fixed angular orientation. The relative motion may be rotation around a center of the substrate.

In another aspect, a polishing assembly includes a polishing pad support and a polishing pad held by the pad support. The polishing pad support includes an annular member and a recess with a substrate-facing opening. The polishing pad has a polishing surface to contact a substrate during polishing. A perimeter portion of the polishing pad is vertically fixed to the annular member and a remainder of the polishing pad within the perimeter portion is vertically free. The substrate-facing opening of the polishing pad support is sealed by the polishing pad to define a pressurizable chamber to provide an adjustable pressure on a back surface of the polishing pad.

Implementations may include one or more of the following features. An adhesive may secure the perimeter portion of the polishing pad to the annular member. One or more clamps may hold the perimeter section of the polishing pad on the annular member. The polishing pad support may include a base and membrane secured to the base, a volume between the base and the membrane may define a second pressurizable chamber such that an outer surface of the membrane provides a second adjustable pressure on the back surface of the polishing pad. The membrane and second pressurizable chamber may be configured such that a pressure in the second pressurizable chamber controls a lateral size of a loading area of the polishing surface against a substrate.

In another aspect, a polishing pad includes an upper portion, one or more lower portions, and a plurality of apertures. The upper portion has an upper surface for attachment to a pad carrier and a first lateral dimension. The one or more lower portions project downward from the upper portion. A bottom surface of the one or more lower portions provide a contact surface to contact a substrate during chemical mechanical polishing. Each lower portion has a second lateral dimension that is less than the first lateral dimension such that the upper portion projects past all lateral sides of the lower portion. The plurality of apertures are in the upper surface of the upper portion to receive projections from the pad carrier. The apertures are positioned in a section of the upper portion of the polishing pad laterally outward of the lower portion.

Implementations may include one or more of the following features. The plurality of apertures may be positioned at corners of the polishing pad. The polishing pad may be rectangular. The one or more lower portions may have an arc-shaped contact surface. A plurality of grooves for slurry transport may be formed on the contact surface of the lower portion of the polishing pad.

Advantages of the invention may include one or more of the following.

A small pad that undergoes an orbiting motion can be used to compensate for non-concentric polishing uniformity. The orbital motion can provide an acceptable polishing rate while avoiding overlap of the pad with regions that are not desired to be polished, thus improving substrate uniformity. In addition, in contrast with rotation, an orbital motion that maintains a fixed orientation of the polishing pad relative to the substrate can provide a more uniform polishing rate across the region being polished.

Making the top portion of the polishing pad that is secured to the polishing pad support laterally wider than the bottom protrusion that makes contact with the substrate can increase the available area for connection of the pad to the support, e.g., by a pressure sensitive adhesive. This can make the polishing pad less susceptible to delamination during the polishing operation.

A polishing pad with an arc-shaped contact area for contacting the substrate can provide improved polishing rate, while maintaining satisfactory radial resolution of the polishing region.

An alignment feature can ensure that the limited contact area of the polishing pad is placed in a known position laterally relative to the pad support, thus reducing the likelihood of polishing an undesired region of the substrate.

Providing a portion of the polishing pad that flexes can reducing flexing of the portion of the contact surface of the polishing pad, thus improving the likelihood that the region polished matches what is expected by the operator.

Grooves in the projection of the polishing pad can facilitate transport of slurry, and can thus improve the polishing rate.

A portion of the polishing pad that does not contact the substrate can be formed out of lower-cost material, thus reducing the total pad cost.

A pad carrier that permits control of size of the portion of the contact area that is loaded against the substrate permits the loading area to be matched to the size of the spot to be polished, thus improving throughput while avoiding polishing an undesired region of the substrate.

Overall, non-uniform polishing of the substrate can be reduced, and the resulting flatness and finish of the substrate can be improved.

Other aspects, features, and advantages of the invention will be apparent from the description and drawings, and from the claims.

DESCRIPTION OF DRAWINGS

FIG. 6A is a schematic cross-sectional top view of the system of FIG. 6 with relation to a substrate;

FIG. 6B is a schematic cross-sectional top view of the system of FIG. 6, with a quarter revolution turn with respect to FIG. 6A;

FIG. 7A is a schematic cross-sectional side view of a movable polishing pad support connected to the polishing pad with a plurality of clamps;

FIG. 7B is a schematic cross-sectional view of an implementation of a movable polishing pad support that includes an interior pressurized space enclosed by an internal membrane;

FIG. 8A is a schematic cross-sectional side view of the movable polishing pad support of FIG. 7B in a state of low pressure;

FIG. 8B is a schematic cross-sectional side view of the movable polishing pad support of FIG. 7B in a state of high pressure;

FIG. 12 is a schematic top view of an implementation of a polishing system with a polishing pad that has an arc-shaped projection layer which forms a corresponding arc-shaped loading area; and FIG. 13 is a schematic cross-sectional side view of an implementation of a polishing system with an arc-shaped polishing surface that undergoes orbital motion.

Like reference symbols in the various drawings indicate like elements.

DETAILED DESCRIPTION

1. Introduction

Some polishing processes result in thickness non-uniformity across the surface of the substrate. For example, a bulk polishing process can result in under-polished regions on the substrate. To address this problem, after the bulk polishing it is possible to perform a "touch-up" polishing process that focuses on portions of the substrate that were underpolished.

In a bulk polishing process, polishing occurs over all of the front surface of the substrate, albeit potentially at different rates in different regions of the front surface. Not all of the surface of the substrate might be undergoing polishing at a given instant in a bulk polishing process. For example, due to the presence of grooves in the polishing pad, some portion of the substrate surface might not be in contact with the polishing pad. Nevertheless, over the course of the bulk polishing process, due to the relative motion between the polishing pad and substrate, this portion is not localized, so that all of the front surface of the substrate is subjected to some amount of polishing.

In contrast, in a "touch-up" polishing process, the polishing pad can contact less than all of the front surface of the substrate. In addition, the range of motion of the polishing pad relative to the substrate is configured such that over the course of the touch-up polishing process, the polishing pad contacts only a localized region of the substrate, and a significant portion (e.g., at least 50%, at least 75%, or at least 90%) of the front surface of the substrate never contacts the polishing pad and thus is not subject polishing. For example, in a touch-up polishing, the contact area can be substantially smaller than the radius surface of the substrate.

As noted above, some bulk polishing processes result in non-uniform polishing. In particular, some bulk polishing processes result in localized non-concentric and non-uniform spots that are underpolished. In a touch-up polishing process, a polishing pad that rotates about a center of the substrate may be able to compensate for concentric rings of non-uniformity, but may not be able to address localized non-concentric and non-uniform spots, e.g., angular asymmetry in the thickness profile. However, a small pad, e.g., a small pad that undergoes an orbiting motion, can be used to compensate for non-concentric polishing uniformity. For some implementations, during polishing, the polishing pad can undergo an orbital motion with a fixed angular orientation.

Figure 1:
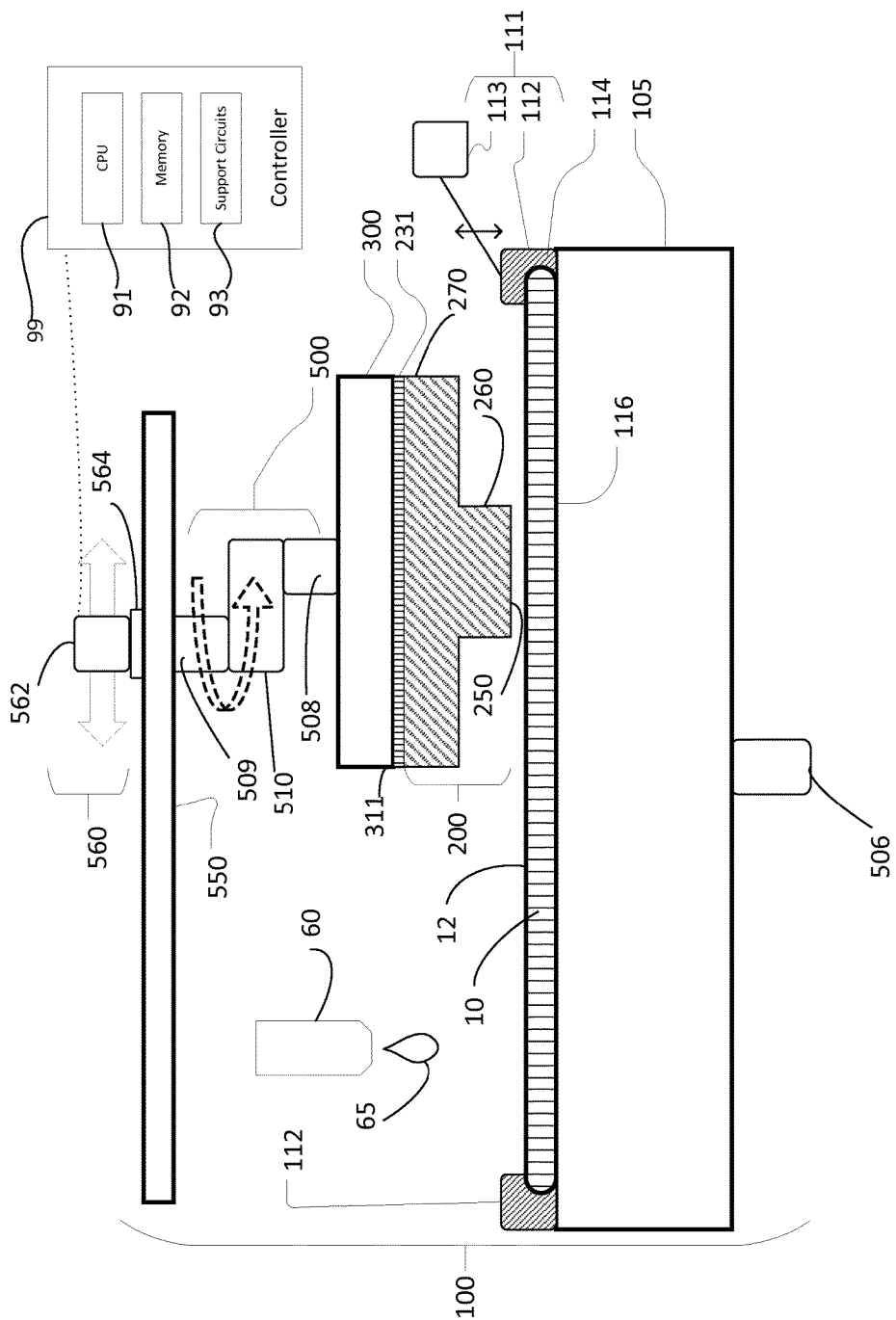
FIG. 1 is a schematic cross-sectional side view of a polishing system.

Referring to FIG. 1, a polishing apparatus 100 for polishing localized regions of the substrate includes a substrate support 105 to hold a substrate 10, and a movable polishing pad support 300 to hold a polishing pad 200. The polishing pad 200 includes a polishing surface 250 that has a smaller diameter than the radius of the substrate 10 being polished.

The polishing pad support 300 is suspended from a polishing drive system 500 which will provide motion of the polishing pad support 300 relative to the substrate 10 during a polishing operation. The polishing drive system 500 can be suspended from a support structure 550.

In some implementations, a positioning drive system 560 is connected to the substrate support 105 and/or the polishing pad support 300. For example, the polishing drive system 500 can provide the connection between the positioning drive system 560 and the polishing pad support 300. The positioning drive system 560 is operable to position the pad support 300 at a desired lateral position above the substrate support 105. For example, the support structure 550 can include two linear actuators 562 and 564, which are oriented perpendicular relative to one another over the substrate support 105, to provide the positioning drive system 560. Alternatively, the substrate support 105 could be supported by two linear actuators. Alternatively, the substrate support 105 can be rotatable, and the polishing pad support 300 can be suspended from a single linear actuator that provides motion along a radial direction. Alternatively, the polishing pad support can be suspended from a rotary actuator 508 and the substrate support 105 can be rotatable with a rotary actuator 506.

Optionally, a vertical actuator (shown by 506 and/or 508) can be connected to the substrate support 105 and/or the polishing pad support 300. For example, the substrate support 105 can be connected to a vertically drivable piston that can lift or lower the substrate support 105.

The polishing apparatus 100 includes a port 60 to dispense polishing liquid 65, such as abrasive slurry, onto the surface 12 of the substrate 10 to be polished. The polishing apparatus 100 can also include a polishing pad conditioner to abrade the polishing pad 200 to maintain the polishing pad 200 in a consistent abrasive state.

In operation, the substrate 10 is loaded onto the substrate support 105, e.g., by a robot. The positioning drive system 500 positions the polishing pad support 300 and polishing pad 200 at a desired position on the substrate 10, and the vertical actuator 506 moves the substrate 10 into contact with the polishing pad 200 (or vice versa with actuator 508). The polishing drive system 500 generates the relative motion between the polishing pad support 300 and the substrate support 105 to cause polishing of the substrate 10.

During the polishing operation, the positioning drive system 560 can hold the polishing drive system 500 and substrate 10 substantially fixed relative to each other. For example, the positioning system can hold the polishing drive system 500 stationary relative to the substrate 10, or can sweep the polishing drive system 500 slowly (compared to the motion provided to the substrate 10 by the polishing drive system 500) across the region to be polished. For example, the instantaneous velocity provided to the substrate by the positioning drive system 500 can be less than 5%, e.g., less than 2%, of the instantaneous velocity provided to the substrate by the polishing drive system 500.

The polishing system also includes a controller 90, e.g., a programmable computer. The controller can include a central processing unit 91, memory 92, and support circuits 93. The controller's 90 central processing unit 91 executes instructions loaded from memory 92 via the support circuits 93 to allow the controller to receive input based on the environment and desired polishing parameters and to control the various actuators and drive systems.

For a "touch-up" polishing operation, the controller 90 is programmed to control the positioning drive system 560 such even if the polishing drive system 500 is being swept slowly, the range of motion of the polishing drive system 500 is constrained so that over the course of the touch-up polishing process, a significant portion (e.g., at least 50%, at least 75%, or at least 90%) of the front surface of the substrate never contacts the polishing pad and thus is not subject polishing.

2. The Polishing System

A. The Substrate Support

Referring to FIG. 1, the substrate support 105 is plate-shaped body situated beneath the polishing pad support. The upper surface 116 of the body provides a loading area large enough to accommodate a substrate to be processed. For example, the substrate can be a 200 to 450 mm diameter substrate. The upper surface 116 of the substrate support 105 contacts the back surface of the substrate 10 (i.e., the surface that is not being polished) and maintains its position.

The substrate support 105 is about the same radius as the substrate 10, or larger. In some implementations, the substrate support 105 is slightly narrower (e.g., see FIG. 2) than the substrate, e.g., by 1-2% of the substrate diameter. When placed on the support 105, the edge of the substrate 10 slightly overhangs the edge of the support 105. This can provide clearance for an edge grip robot to place the substrate on the support. In some implementations, the substrate support 105 is wider than the substrate. In this case, a robot with an end effector having a vacuum chuck can be used to place the substrate on the support. In either case, the substrate support 105 can make contact with a majority of the surface the backside of the substrate.

In some implementations, as shown in FIG. 1, the substrate support 105 maintains the substrate 10 position during polishing operation with a clamp assembly 111. In some implementations, the clamp assembly 111 can be a single annular clamp ring 112 that contacts the rim of the top surface of the substrate 10. Alternatively, the clamp assembly 111 can include two arc-shaped clamps 112 that contact the rim of the top surface on opposite sides of the substrate 10. The clamps 112 of the clamp assembly 111 can be lowered into contact with the rim of the substrate by one or more actuators 113. The downward force of the clamp restrains the substrate from moving laterally during polishing operation. In some implementations, the clamp(s) include downwardly a projecting flange 114 that surrounds the outer edge of the substrate.

Figure 2:
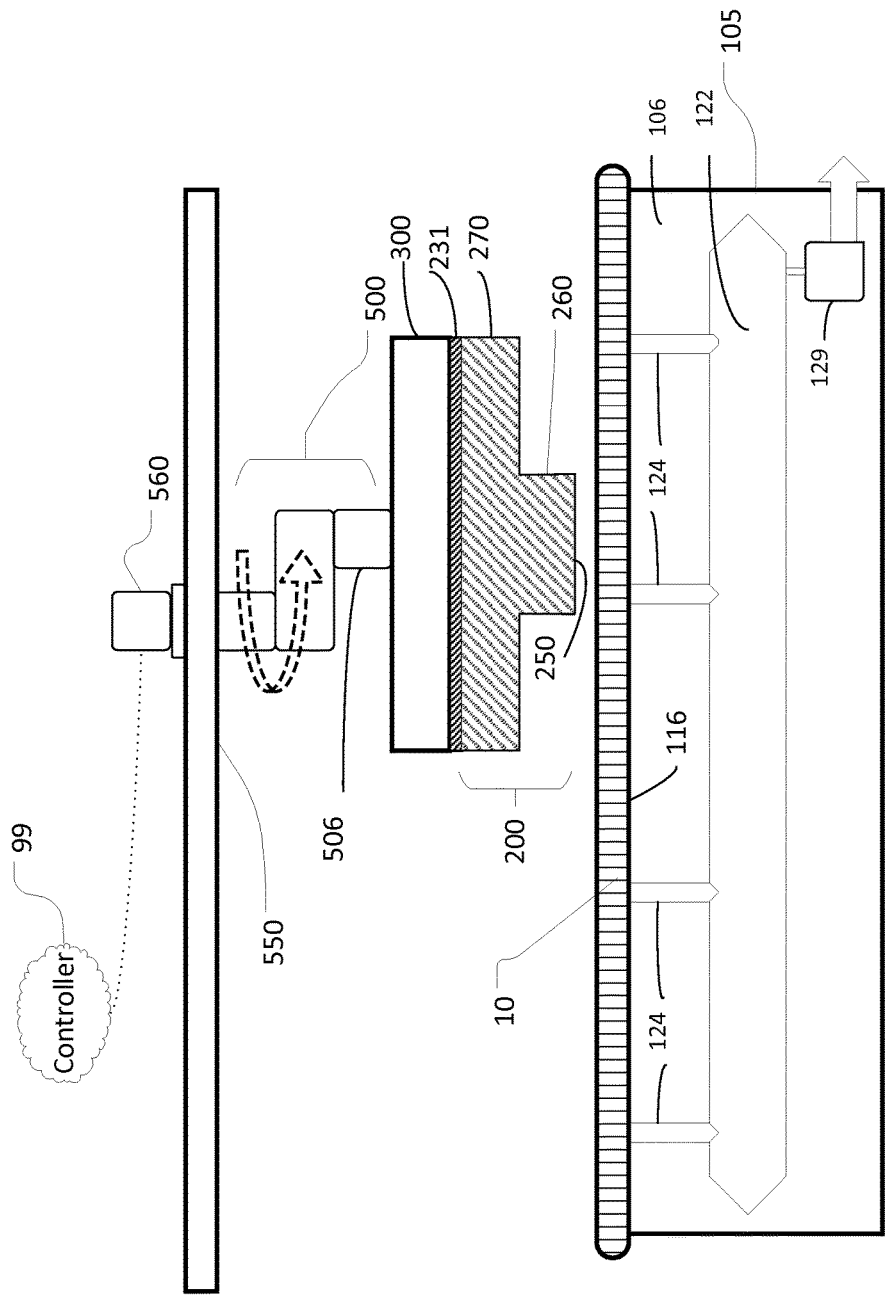
FIG. 2 is a schematic cross-sectional side view of an implementation of a polishing system that includes a vacuum chuck to hold the substrate.

In some implementations, as shown in FIG. 2, the substrate support 105 is a vacuum chuck 106. The vacuum chuck 106 includes a chamber 122 and a plurality of ports 124 connecting the chamber 122 to the surface 116 that supports the substrate 10. In operation, air can be evacuated from of the chamber 122, e.g., by a pump 129, thus applying suction through the ports 124 to hold the substrate in position on the substrate support 106.

Figure 3:
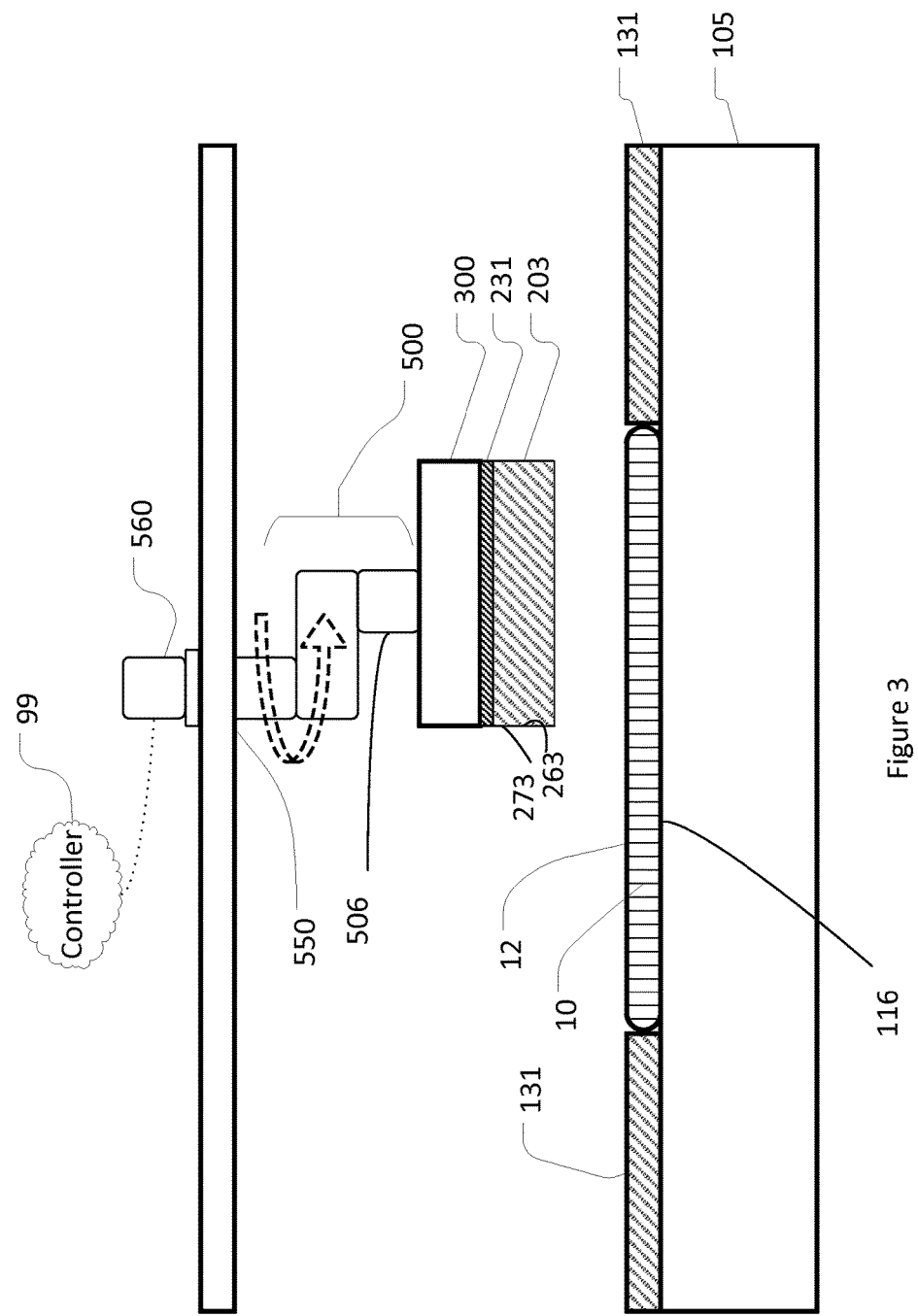
FIG. 3 is a schematic cross-sectional side view of an implementation of a polishing system with a polishing pad that does not include a downward projection.

In some implementations, as shown in FIG. 3, the substrate support 105 includes a retainer 131. The retainer 131 can be attached to and project above the surface 116 that supports the substrate 10. Typically the retainer is at least as thick (measured perpendicular to the surface 12) as the substrate 10. In operation, the retainer 131 surrounds the substrate 10. For example, the retainer 131 can be an annular body with a diameter slightly larger than the diameter of the substrate 10. During polishing, friction from the polishing pad 200 can generate a lateral force on the substrate 10. However, the retainer 131 constrains the lateral motion of the substrate 10.

The various substrates support features described above can be optionally be combined with each other. For example, the substrate support can include both a vacuum chuck and a retainer.

In addition, although substrate support configurations are shown in conjunction with the pressure sensitive adhesive movable pad support configurations for ease of illustration, they can be used with any of the embodiments of the pad support head and/or drive system described below.

B. The Polishing Pad

Referring to FIG. 1, the polishing pad 200 has a polishing surface 250 that is brought into contact with the substrate 10 in a contact area, also called a loading area, during polishing. The polishing surface 250 can be of a smaller diameter than the radius of the substrate 10. For example, for the diameter of the polishing surface can be about can be about 5-10% of the diameter of the substrate. For example, for wafer that ranges from 200 mm to 300 mm in diameter, the polishing surface can be between 10 and 30 mm in diameter. A smaller polishing surface provides more precision but lower throughput.

In some implementations, less than 1% of the substrate surface can be contacted at any given time by the polishing surface. In general, while this can be useful for a touch-up polishing operation, such a small area would not be acceptable for a bulk polishing operation due to low throughput.

In some implementations, e.g., as shown in FIG. 3, the entire polishing pad, e.g., as measured to the outer edge of the pad, has a smaller diameter than the radius of the substrate 10. For example, for the diameter of the polishing pad can be about can be about 5-10% of the diameter of the substrate.

In the example in FIG. 1, the polishing pad 200 is located above the upper surface of the substrate 10, and includes an upper portion 270 which is coupled to the bottom of the movable pad support 300, and a lower portion 260 which has a bottom surface 250 that makes contact with the substrate 10 during polishing operation. In some instances, as shown in FIG. 1, the bottom portion 260 of the polishing pad 200 is provided by a protrusion from a wider upper portion 270. The bottom surface 250 of the protrusion 260 comes into contact with the substrate during polishing operation and provides the polishing surface.

In the example in FIG. 1, the movable pad support 300 is coupled to the upper portion 270 of the polishing pad 200 using a pressure sensitive adhesive 231. The pressure sensitive adhesive 231, applied between the bottom surface of the polishing pad support 300 and the top surface of the polishing pad 200, maintains the polishing pad 200 on the pad support 300 coupling during the polishing operation.

By making the upper portion 270 of the polishing pad 200 wider than the lower portion 260, the available surface area for the adhesive 231 is increased. Increasing the surface area of the adhesive 231 can improve the bond strength between the pad 200 and pad support, and reduce the risk of delamination of the polishing pad during polishing.

Referring to FIG. 3, the polishing pad 203 can have the same radius in its lower portion 260 as in its top portion 273. However, when a pressure sensitive adhesive 231 provides the coupling between the pad and the movable pad support 300, it is preferable for the bottom portion 263 to be narrower than the top portion 273.

Figure 5:
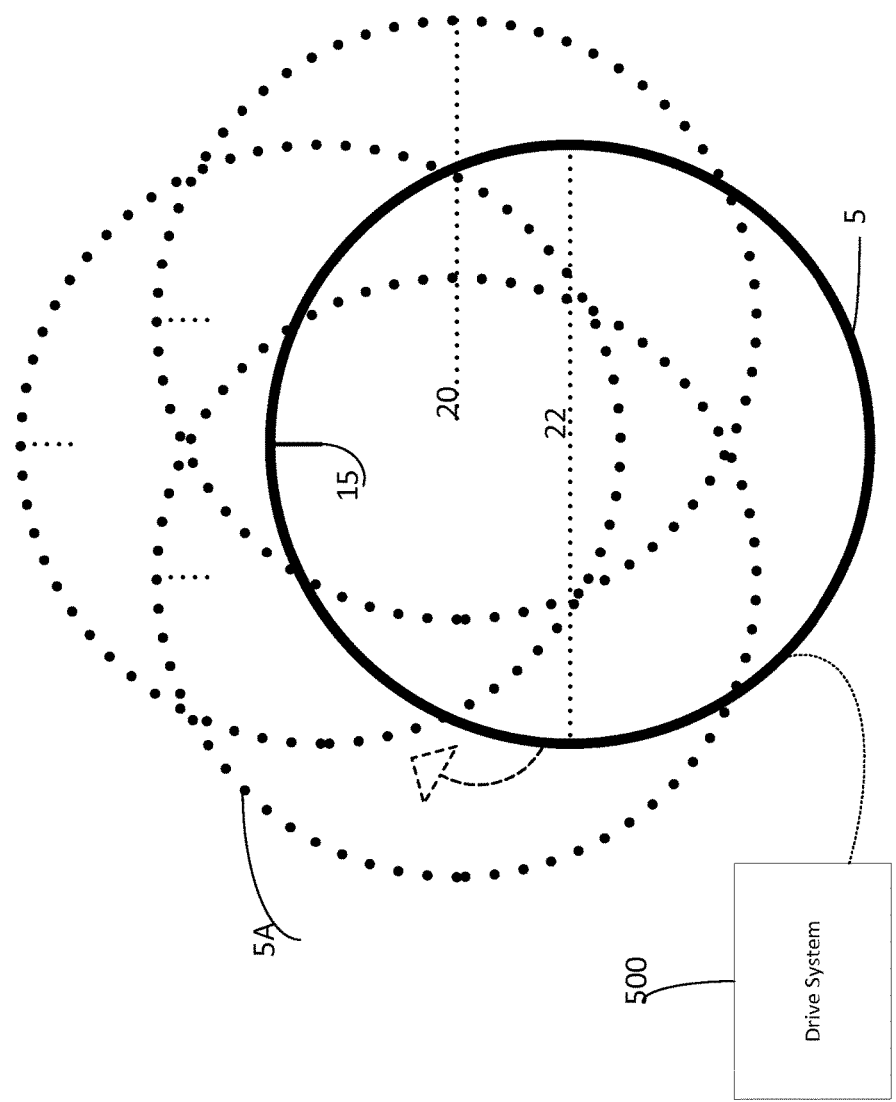
FIG. 5 is a schematic cross sectional top view illustrating a polishing pad that moves in an orbit while maintaining a fixed angular orientation.

Referring to FIG. 5, the contact area 5 of the polishing pad can be a disk-shaped geometry 5 formed by a disk-shaped bottom protrusion of the polishing pad.

Referring to FIGS. 9A and 9B, the contact area 901 of the polishing pad 110 which makes contact with the substrate 10 can be an arc-shaped contact area 901 formed by an arc-shaped protrusion 290 of the polishing pad.

Referring to FIG. 1, in some implementations the diameter of the upper portion 270 of the polishing pad 200 can be smaller than the diameter of the substrate 10.

Figure 4:
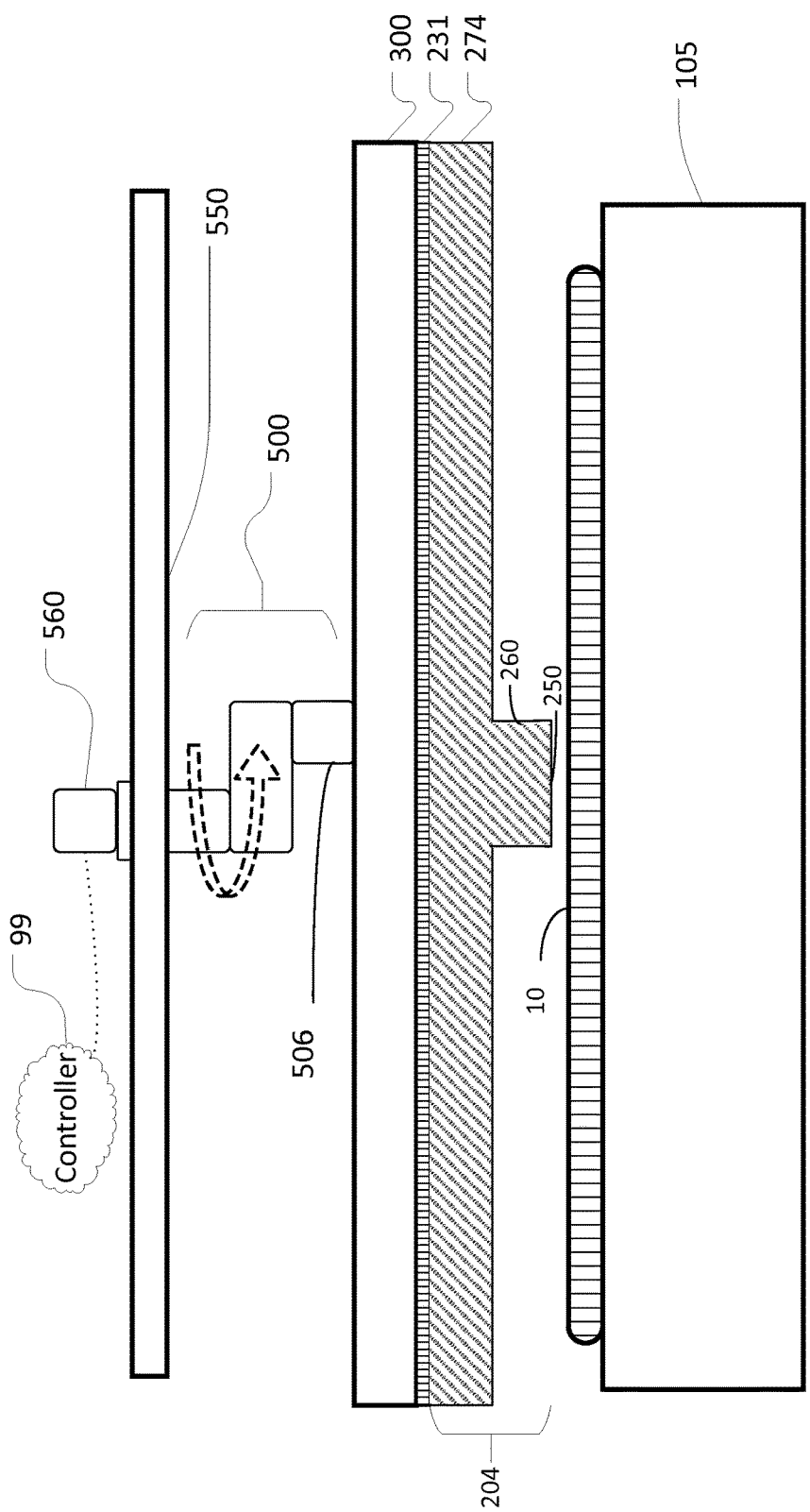
FIG. 4 is a schematic cross-sectional side view of an implementation of a polishing system with a polishing pad that has an upper layer that has a larger diameter than the substrate, and a downward projection with a smaller diameter than the substrate.

Referring to FIG. 4, in some implementations the diameter of the upper portion 274 of the polishing pad 204 can be larger than the diameter of the substrate 10.

Referring to FIG. 1, the polishing pad 200 can consist of a single layer of uniform composition. In this case, the material composition of the upper portion 270 and of the lower portion 260, also called the protrusion 260, are the same.

Figure 10A:
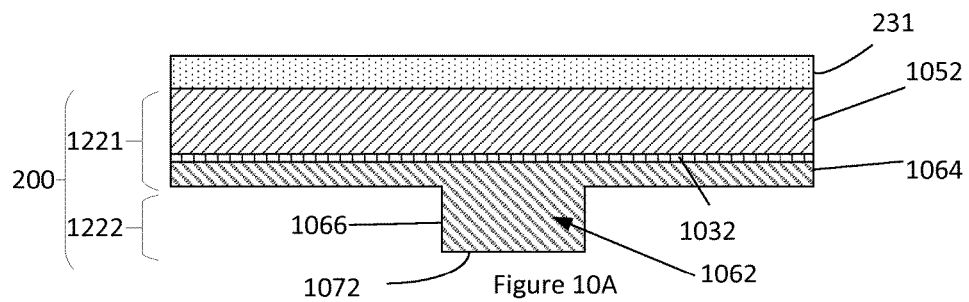
FIGS. 10A and 10B are schematic cross-sectional side views of implementations of a polishing pad.
Figure 10B:
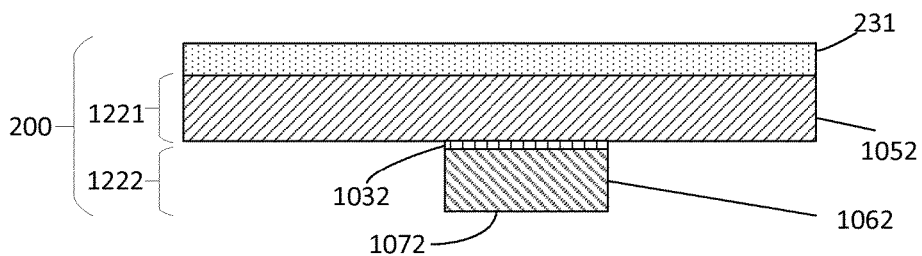

Referring to FIG. 10B, in some implementations, the polishing pad 200 can include two or more layers of different composition, e.g., a polishing layer 1062 and a more compressible backing layer 1052. Optionally, an intermediate pressure sensitive adhesive layer 1032 can be used to secure the polishing layer 1061 to the backing layer 1061. In this case, the upper portion 1221 can correspond to the backing layer 102 and the lower portion 1222 can correspond to the polishing layer 1062. The polishing pad can be coupled to a polishing pad support via the pressure sensitive adhesive layer 231.

Referring to FIG. 10A, in some implementations, the polishing pad can include two or more layers of different composition, and the upper portion 1221 of the polishing pad 200 can include both the backing layer 1052 and an upper section 1064 of the polishing layer 1062. Thus, the polishing layer 1062 includes both a lower section 1066 that provides the protrusion 1222 and the upper section 1062, with the upper section 1064 wider than the lower section 1066.

The polishing pad can be coupled to a polishing pad support via the pressure sensitive adhesive layer 321.

In either implementation shown in FIG. 10A or FIG. 10B, the polishing layer 1062 can consist of a single layer of uniform composition. For example, in either implementation shown in FIG. 10A or FIG. 10B, the portion of the pad that contacts the substrate can be of a conventional material, e.g., a microporous polymer such as polyurethane.

Referring to FIG. 10A, the backing layer 1052 can be relatively soft to allow for better polishing pad flexibility when polishing an uneven substrate surface spot. The polishing layer 1064 can be a hard polyurethane.

Referring to FIG. 10B, the backing layer 1052 can be relatively soft, but also can be a flexible incompressible layer made of material, such as polyethylene terephthalate, e.g., Mylar™. For example, such a pad configuration can be used in implementation in which the polishing pad of FIG.

Figure 11:
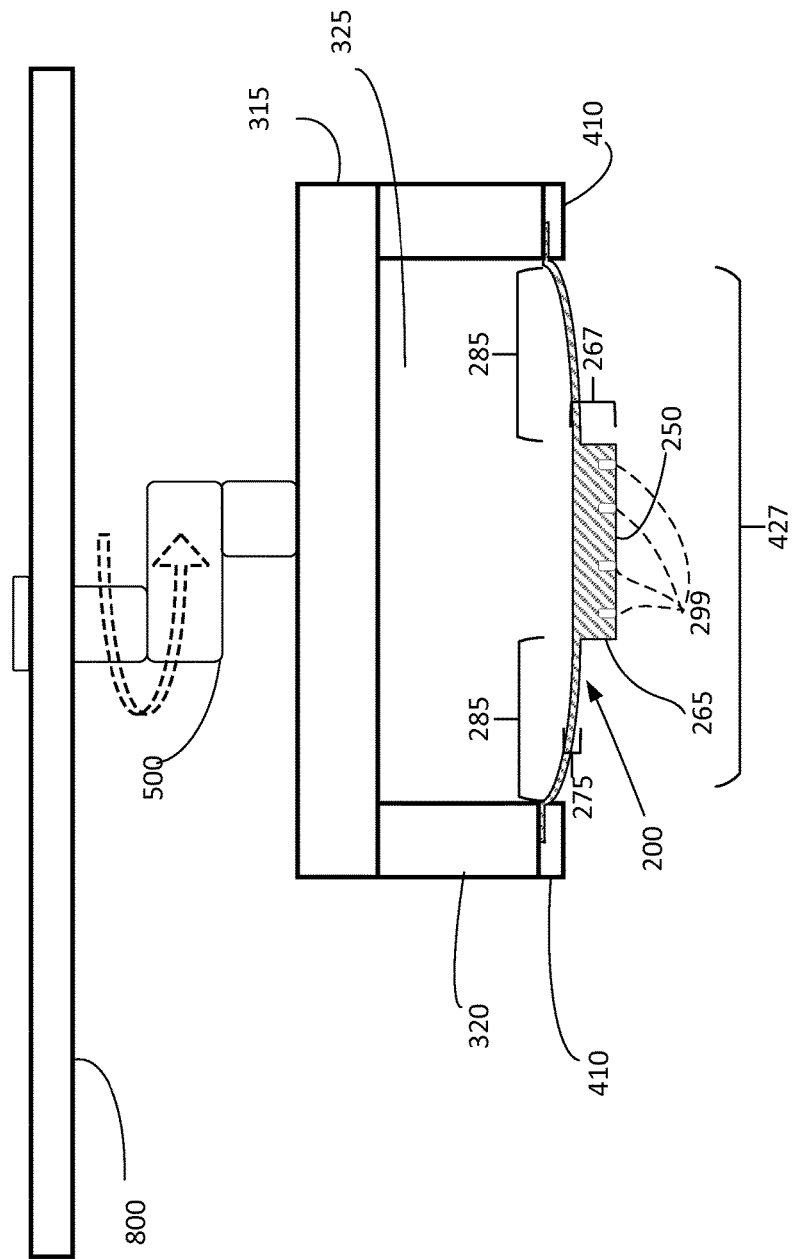
FIG. 11 is a schematic cross-sectional side view of another implementation of a movable polishing pad support.

10B is coupled to the pressurized chamber polishing pad support of FIG. 11. The polishing layer 1062 can be a hard polyurethane.

Referring to FIG. 11, in some implementations, the polishing pad 205 can include an upper portion 275 and a lower portion 260. The polishing pad 205 has a thicker lateral section 267 which includes the combined lower portion 260 and upper portion 275. The upper portion 275 extends laterally on either side of the thicker section 267 to provide lateral side sections 285. The lateral side sections 285 flex in response to pressure on the thicker section 267. The thicker section 267 can have a pad thickness of about 2 mm in the polishing area, which is similar to a large sized pad. The pad thickness in the flexing lateral sections 285 can be about 0.5 mm.

In some implementations, the bottom surface 250 of the lower portion of the polishing pad 200 can include grooves to permit transport of slurry during a polishing operation. The grooves 299 can be shallower than the depth of the lower portion 260 (e.g., see FIG. 11). However, in some implementations the lower portion does not include grooves. If the polishing pad includes grooves, the grooves 299 can extend entirely across the lateral width of the lower portion 260. In addition, the grooves can be shallower than the vertical thickness of the lower portion 260, i.e., the grooves pass vertically partially but not entirely through the lower portion 260.

Figure 9:
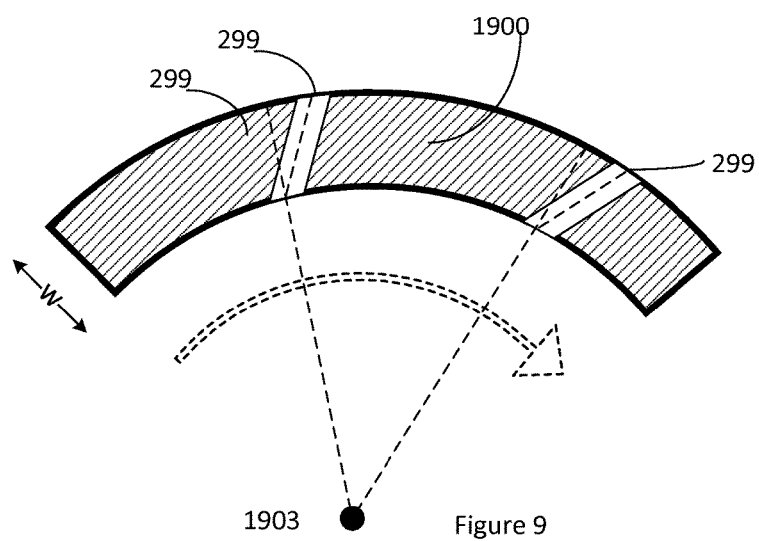
FIG. 9 is a schematic bottom view of a contact area of a polishing pad.

Referring to FIG. 9, the bottom surface 1900 of the polishing pad 200 can be an arc-shaped area. If such a polishing pad includes grooves, the grooves 299 can extend entirely across the lateral width of the arc-shaped area. The grooves 299 can be spaced at uniform pitch along the length of the arc-shaped area. Each grooves 299 can extend along a radius that passes through the groove and the center 1903 of the arc-shaped area, or be positioned at an angle, e.g., 45°, relative to the radius.

Figure 14:
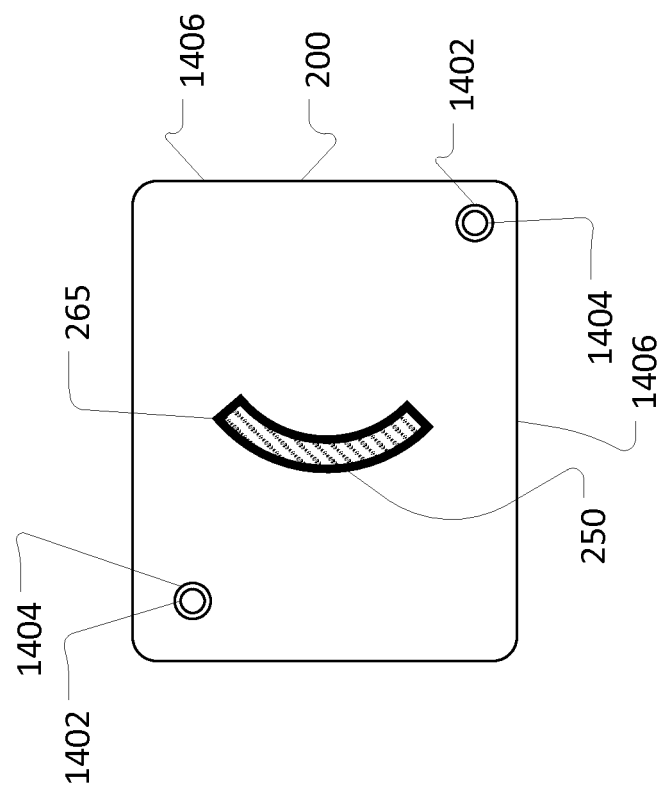
FIG. 14 is a schematic top view of a polishing pad.

Referring to FIG. 14, in some implementations, the polishing pad 200 includes alignment features that mate with matching features on the pad support 300 to ensure that the polishing pad 200, and the lower portion 260 that provides the contact area 250, is in a known lateral position relative to the pad support 300.

For example, the polishing pad 200 can include recesses 1402 formed in the back surface of the polishing pad 200. The recesses 1402 can be machine drilled into the polishing pad in a known position relative to the contact area 250. The recesses 1402 can be positioned in the thin flange or outer lateral portion 285 of the upper portion 270 of the polishing pad 200. The recesses can extend partially or entirely through the polishing pad. The pad support 300 can include pins 1404, e.g., projecting downwardly from the plate, that fit into the recesses 1402.

As another example, at least some the edges 1406 of the polishing pad 200 can be machined after the contact area 250 is defined on the polishing pad 200. The pad support 300 can include a recess machined into the support plate. The edges of the recess include alignment surfaces, and the edges of the 1406 of the polishing pad are positioned to abut the alignment surface of the recess in the plate.

The lower portion 260 of the polishing pad 200 that contacts the substrate can be formed of a high-quality material, e.g., a material meeting high precision specifications of rigidity, porosity, and the like. However, other portions of the polishing pad that do not contact the substrate need not meet such high precision specifications, and therefore can be formed out of lower-cost material. This can reduce the total pad cost.

C. The Drive System and Orbital Motion of the Pad

Referring to FIGS. 1 and 5, the polishing drive system 500 can be configured to move the coupled polishing pad support 300 and polishing pad 200 in an orbital motion above the substrate 10 during the polishing operation. In particular, as shown in FIG. 5, the polishing drive system 500 can be configured to maintain the polishing pad in a fixed angular orientation relative to the substrate during the polishing operation.

Referring to FIG. 5, the radius of orbit 20 of the polishing pad in contact with the substrate is preferably smaller than the diameter 22 of the contact area. For example, the radius of orbital can be about 5-50%, e.g., 5-20%, of the diameter of the contact area. For a 20 to 30 mm diameter contact area, the radius of orbit can be 1-6 mm. This achieves a more uniform velocity profile in the loading area 5. The polishing pad can revolve in its orbit at a rate of 1,000 to 5,000 revolutions per minute ("rpm").

Figure 6:
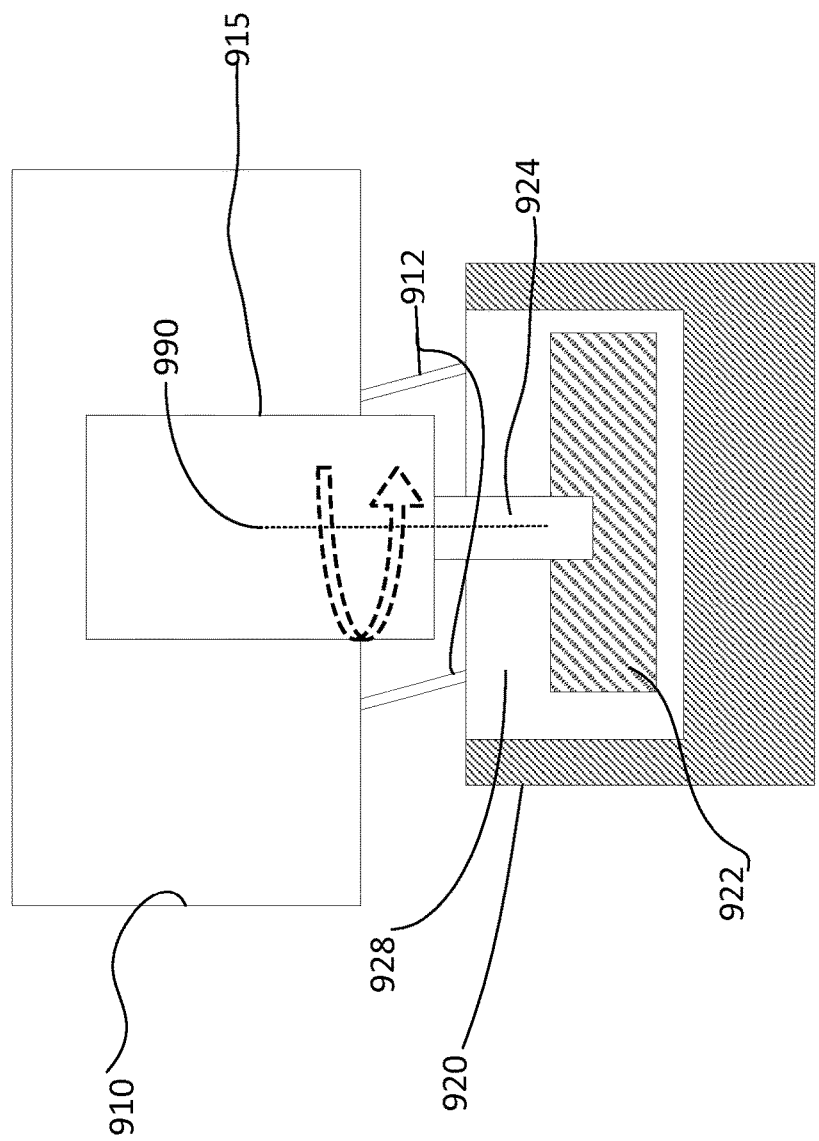
FIG. 6 is a schematic cross-sectional top view of the polishing pad support and drive train system of a polishing system.

Referring to FIG. 6, the drive train can include a mechanical system base 910 which achieves orbital motion with a single actuator 915. A motor output shaft 924 is connectively coupled to a cam 922. The cam 922 extends into a recess 928 in the polishing pad holder 920. During the polishing operation, the motor output shaft 924 rotates around a rotational axis 990, causing the cam 922 to revolve the polishing pad holder 920. A plurality of anti-rotation links 912 extend from the mechanical system base 910 to the upper portion of the polishing pad holder 920 to prevent rotation of the pad holder 920. The anti-rotation links 912, in conjunction with motion of cam 922, achieve orbital motion of the polishing pad support, in which the angular orientation of the polishing pad holder 920 does not change during polishing operation.

Orbital motion, as depicted in FIGS. 6A and 6B, can maintain a fixed angular orientation of the polishing pad relative to the substrate during polishing operation. As the central motor output shaft 620 rotates, the cam 625, in combination with anti-rotational links 630 connecting the mechanical system base above to the polishing pad support, translates the rotational motion into orbital motion for the polishing pad 610. This achieves a more uniform velocity profile than simple rotation.

In some implementations, the polishing drive system and the positioning drive system are provided by the same components. For example, a single drive system can include two linear actuators configured to move the pad support head in two perpendicular directions. For positioning, the controller can cause the actuators to move the pad support to the desired position on the substrate. For polishing, the controller can cause the actuators to the actuators to move the pad support in the orbital motion, e.g., by applying phase offset sinusoidal signals to the two actuators.

Referring to FIG. 1, in some implementations, the polishing drive system 500 can include two rotary actuators. For example, the polishing pad support can be suspended from a rotary actuator 508, which in turn is suspended from a second rotary actuator 509. During the polishing operation, the second rotary actuator 509 rotates an arm 510 that sweeps the polishing pad support 300 in the orbital motion. The first rotary actuator 508 rotates, e.g., in the opposite direction but at the same rotation rate as the second rotary actuator 509, to cancel out the rotational motion such that the polishing pad assembly orbits while remaining in a substantially fixed angular position relative to the substrate.

D. Pad Support

The movable pad support 300 holds the polishing pad, and is coupled to the polishing drive system 500.

In some implementations, e.g., as shown in FIGS. 1-4, the pad support 300 is a simple rigid plate. The lower surface 311 of the plate is sufficiently large to accommodate the upper portion 270 of the polishing pad 200.

However, the pad support 300 can also include an actuator 508 to control a downward pressure of the polishing pad 200 on the substrate 10.

In the example in FIG. 7A, a pad support 300 that can apply an adjustable pressure on the polishing pad 200 is shown. The pad support 300 includes a base 317 that is coupled to the polishing drive system 500. A bottom of the base 317 includes a recess 327. The pad support 300 includes a clamp 410 that hold the rim of the polishing pad 200 on the base 317. The polishing pad 200 can cover the recess 327 to define a pressurizable chamber 426. By pumping a fluid into or out of the chamber 426, downward pressure of the polishing pad 200 on the substrate 10 can be adjusted.

In the some implementations, as in FIGS. 7B, 8A, and 8B the pad support 300 can have an interior membrane 405 defining a first pressurizable chamber 406 between the membrane 405 and the base 317. The membrane is positioned to contact the side 275 of the polishing pad 200 farther from the polishing surface 258. The membrane 405 and the chamber 406 are configured such that when the pad support 300 holds the polishing pad 200 during a polishing operation, the pressure in the chamber 406 controls the size of the loading area 809 of the polishing pad 200 on the substrate 10. When the pressure inside the chamber increases, the membrane expands its radius, applying pressure to a larger portion of the bottom protrusion layer of the pad and thus increasing the area of the loading area 810. When pressure decreases, the result is a smaller-sized loading area 809.

Referring to FIG. 11, in some implementations, the polishing pad support 315 can include an internal pressurizable chamber 325 formed by walls 320 of the polishing pad support 315. The chamber 325 can have a substrate-facing opening 327. The opening 327 can be sealed by securing the polishing pad 200 to the polishing pad support 315, e.g., by a clamp 410. The pressure in the pressure chamber 425 can be dynamically controlled, e.g., by a controller and hydrostatic pump, during a polishing operation to adjust to the non-uniform spot being polished.

Referring to FIG. 12, in some implementations, the contact area 1301 of the polishing pad 20 can be arc-shaped area. For example, the protrusion can be arc-shaped. The drive system 500 can rotate the arc around a center 1302 of the substrate 10.

Referring to FIG. 13, in some embodiments, the polishing pad 200 contact area 901 can be an arc-shaped area that undergoes orbital motion relative to the substrate 10.

3. Conclusion

The size of a spot of non-uniformity on the substrate will dictate the ideal size of the contact area during polishing of that spot. If the contact area is too large, correction of underpolishing of some areas on the substrate can result in overpolishing of other areas. On the other hand, if the contact area is too small, the pad will need to be moved across the substrate to cover the underpolished area, thus decreasing throughput.

In a substrate processing operation, the substrate can first be subjected to a bulk polishing process in which polishing is performed over the entirety of the front surface of the substrate. Optionally, after the bulk polishing operation, non-uniformity of the substrate can be measured, e.g., at an in-line or stand-alone metrology station. The substrate can then be transported to the polishing apparatus 100 and subjected to a touch-up polishing process. Control of the region to be polished at the polishing apparatus can be based on identification of under-polished regions of the substrate from either historical data, e.g., thickness measurements made during qualification, or from measurements of the substrate at the in-line or stand-alone metrology station.

The entire polishing system could be arranged with the front surface of the substrate positioned vertically or facing downwardly (relative to gravity). However, an advantage of having the front surface of the substrate be facing upwardly is that this permits slurry to be distributed on the face of the substrate. Due to the larger size of the substrate relative to the polishing surface of the polishing pad, this can improve slurry retention and thus reduce slurry usage.

A number of embodiments of the invention have been described. Nevertheless, it will be understood that various modifications may be made without departing from the spirit and scope of the invention. For example, the substrate support could, in some embodiments, include its own actuators capable of moving the substrate into position relative to the polishing pad. As another example, although the system described above includes a drive system that moves the polishing pad in the orbital path while the substrate is held in a substantially fixed position, instead the polishing pad could be held in a substantially fixed position and the substrate moved in the orbital path. In this situation, the polishing drive system could be similar, but coupled to the substrate support rather than the polishing pad support. Although generally circular substrate is assumed, this is not required and the support and/or polishing pad could be other shapes such as rectangular (in this case, discussion of "radius" or "diameter" would generally apply to a lateral dimension along a major axis).

Accordingly, other embodiments are within the scope of the following claims.

What is claimed is:

1. A polishing assembly, comprising:
 a polishing pad support, the polishing pad support including a base that has an annular member and a recess with a substrate-facing opening;
 a polishing pad held by the pad support, the polishing pad having a polishing surface to contact a substrate during polishing, wherein a perimeter portion of the polishing pad is vertically fixed to the annular member and a remainder of the polishing pad within the perimeter portion is vertically free; and wherein the substrate-facing opening of the polishing pad support is sealed by the polishing pad to define a first pressurizable chamber to provide a first adjustable pressure on a first portion of a back surface of the polishing pad; and
 a membrane secured to the base within the recess such that a volume between the base and the membrane defines a second pressurizable chamber and an outer surface of the membrane contacts the back surface of the polishing pad in a second portion and is separated from the back surface of polishing pad in the first portion such that the membrane provides a second adjustable pressure on the second portion of the back surface of the polishing pad.

2. The polishing assembly of claim 1, comprising an adhesive securing the perimeter portion of the polishing pad to the annular member.

3. The polishing assembly of claim 1, comprising one or more clamps holding the perimeter portion of the polishing pad on the annular member.

4. The polishing assembly of claim 1, wherein the membrane and second pressurizable chamber are configured such that a pressure in the second pressurizable chamber controls a lateral size of a loading area of the polishing surface against a substrate.

5. The polishing assembly of claim 1, wherein the polishing pad includes a first section having the polishing surface and a second section that is flexible and extends laterally from the first section.

6. The polishing assembly of claim 1, wherein the perimeter portion of the polishing pad has a plurality of apertures to receive projections from the pad support.

7. The polishing assembly of claim 6, wherein the plurality of apertures are positioned at corners of the polishing pad.

8. The polishing assembly of claim 7, wherein the polishing pad is rectangular.

9. The polishing assembly of claim 1, wherein the polishing pad includes an upper portion that extends across the substrate-facing opening and is secured to the annular member to seal the first pressurizable chamber, and a lower portion projecting downward from the upper portion, a bottom surface of the lower portion providing the polishing surface, and wherein the lower portion has a second lateral dimension that is less than a first lateral dimension of the upper portion such that the upper portion projects past all lateral sides of the lower portion.

10. The polishing assembly of claim 9, and wherein a total surface area of the polishing surface from the lower portions is no more than 10% of a surface area of the upper portion.

11. The polishing assembly of claim 9, further comprising a plurality of grooves for slurry transport on the polishing surface of the lower portion of the polishing pad.

* * * * *